(12) United States Patent
Lee et al.

(10) Patent No.: US 7,198,887 B2
(45) Date of Patent: *Apr. 3, 2007

(54) ORGANIC ANTI-REFLECTIVE COATING POLYMER, ITS PREPARATION METHOD AND ORGANIC ANTI-REFLECTIVE COATING COMPOSITION COMPRISING THE SAME

(75) Inventors: Geun-soo Lee, Yongin-shi (KR); Cheol-kyu Bok, Seoul (KR); Seung-chan Moon, Yongin-shi (KR); Ki-soo Shin, Seongnam-shi (KR); Won-wook Lee, Icheon-shi (KR)

(73) Assignee: Hynix Semiconductor Inc., Kyungki-do (KR)

( * ) Notice: Subject to any disclaimer, the term of this patent is extended or adjusted under 35 U.S.C. 154(b) by 36 days.

This patent is subject to a terminal disclaimer.

(21) Appl. No.: 10/811,558

(22) Filed: Mar. 29, 2004

(65) Prior Publication Data

US 2005/0014089 A1    Jan. 20, 2005

(30) Foreign Application Priority Data

Jul. 16, 2003    (KR) .................... 10-2003-0048520

(51) Int. Cl.
*G03F 7/20* (2006.01)
*G03F 7/30* (2006.01)
*G03C 1/825* (2006.01)
*G03C 1/835* (2006.01)

(52) U.S. Cl. .................. 430/325; 430/326; 430/273.1; 430/311; 430/330; 430/331

(58) Field of Classification Search ................ 526/274, 526/278; 438/72; 430/271.1, 273.1
See application file for complete search history.

(56) References Cited

U.S. PATENT DOCUMENTS 3,297,663 A *  1/1967  Hedrbst et al. ............... 526/86

| | | |
|---|---|---|
| 5,879,853 A | 3/1999 | Azuma ....................... 430/166 |
| 6,057,080 A | 5/2000 | Brunsvold et al. ........ 430/273.1 |
| 6,159,457 A * | 12/2000 | Mougin ................... 424/78.03 |
| 6,274,295 B1 | 8/2001 | Dammel et al. ............. 430/322 |
| 6,590,137 B2 * | 7/2003 | Mitchell et al. ............. 604/372 |
| 6,909,191 B2 * | 6/2005 | Hatano et al. ............... 257/761 |
| 2003/0219682 A1 | 11/2003 | Wakiya et al. ........... 430/273.1 |

FOREIGN PATENT DOCUMENTS

JP    8-29972    *  2/1996

OTHER PUBLICATIONS

Machine-assisted English translation for JP8-29972 as provided by JPO.*

* cited by examiner

*Primary Examiner*—Sin Lee
(74) *Attorney, Agent, or Firm*—Marshall, Gerstein & Borun LLP

(57) ABSTRACT

Disclosed are an organic anti-reflective coating polymer having a structure represented by the following formula I, its preparation method and an organic anti-reflective coating composition with respect to an ultra-fine pattern formation process of the photoresist for photolithography technique using ArF light source with a wavelength of 193 nm or VUV light source with a wavelength of 157 nm. An organic anti-reflective coating polymer capable of protecting a photoresist from amines in the atmosphere to minimize the post exposure delay effect after exposure to light and, at the same time, enhances notching status, such as, a pattern distortion caused by diffused reflection, and reducing reflection rate to minimize the swing effect.

Formula I

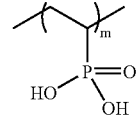

wherein m is an integer ranging from 5 to 5000.

10 Claims, 2 Drawing Sheets

ORGANIC ANTI-REFLECTIVE COATING POLYMER, ITS PREPARATION METHOD AND ORGANIC ANTI-REFLECTIVE COATING COMPOSITION COMPRISING THE SAME

BACKGROUND

1. Technical Field

Improved organic anti-reflective coating polymers of the general formula I are provided as a top layer on a photoresist layer. The polymers are used as an ultra-fine pattern formation process of the photoresist in a photolithography technique using an ArF light source with a wavelength of 193 nm or a VUV light source with a wavelength of 157 nm. The disclosed organic anti-reflective coating polymers are capable of protecting photoresist patterns from amines in the atmosphere thereby minimizing a post exposure delay effect after exposure to light and, at the same time, enhancing notching status. As a result, a pattern distortion caused by diffused reflection is minimized and the reflection rate is reduced thereby minimizing a swing effect. Preparation methods and an organic anti-reflective coating composition comprising the same are also disclosed.

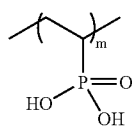

Formula I wherein m is an integer ranging from 5 to 5000.

2. Description of the Related Art

In semiconductor production processes, an ultra-fine pattern formation process (hereinafter abbreviated as "patterning method") necessarily involves: standing waves caused by variations of optical property of a bottom film layer in the photoresist film and/or thickness of photosensitive film; reflective notching status; and variation of critical dimension (hereinafter referred to as CD) of patterns of the photoresist induced by diffracted light and reflected light from the bottom film layer.

Accordingly, it has been proposed that an intermediate film, a so-called anti-reflective coating, be employed which is able to prevent the light reflection in the bottom film layer prepared by introducing a material having a higher light absorption ability in the bandwidth of wavelength for the exposure light source and located between the bottom film layer and the photoresist. Especially, when exposed to UV light from the light source, a photoresist thin film is transmitted by the UV light, thus allowing the light absorbed in bottom portion of the thin film to be scattered and/or reflected. Such an anti-reflective coating can absorb the scattered and/or reflected light and, thereby, directly affecting the processing of the photoresist.

However, as the patterns are becoming ultra-fine along with the reduction of semiconductor devices to less than 90 nm, it is difficult to completely prevent pattern alteration or distortion generated due to diffused reflection using only the above anti-reflective coating. That is, a bottom anti-reflective coating (hereinafter referred to as BARC) has been introduced between the bottom film layer and the photoresist. Therefore, it requires an improved anti-reflective coating material to be applied on top portion of the photoresist or a method for forming the pattern due to solve the above problem, which can greatly reduce and/or minimize the pattern distortion caused by the diffused reflection.

In processes for forming ultra fine patterns using a light source with a wavelength of 157 nm, compounds containing fluorine as a photosensitive agent are predominately used. Such a fluorine based photosensitive compound has a problem in that it is contaminated by amine compounds in the atmosphere, since carbon-fluorine bond in the photosensitive compound may form a strong hydrogen bond with a nitrogen-hydrogen bond in the amine compounds.

In particular, during the patterning process, a time delay effect for further process after exposure, a so-called post exposure delay effect, occurs and enlarges the contamination problem concerning the fluorine based photosensitive compound by the amine compound such as ammonia in the atmosphere. Therefore, a recent demand exists for a novel anti-reflective coating material or patterning process to minimize the contamination of the photoresist film due to the post exposure delay after the exposure.

Accordingly, due to such problems in the conventional art, there is a need for an additional anti-reflective coating material which can minimize contamination of the photoresist film caused by amine compounds even when it generates the post exposure delay after the exposure while having no adverse effect to formation of patterns by exposure and development processes. In addition, there is a need for techniques which can further reduce alteration or distortion of the pattern caused by the diffused reflection as the anti-reflective coating material is applied together with the conventional anti-reflective coating typically introduced on the bottom portion of the photoresist. An improved method for forming a pattern by employing such anti-reflective coating material is also needed.

SUMMARY OF THE DISCLOSURE

In consideration of the problems of prior art mentioned above, a novel organic anti-reflective coating polymer is disclosed that can protect a photoresist from amine compounds and, thus, minimize adverse effect of a post exposure delay by introducing the coating polymer on top portion of the photoresist in an ultra fine patterning process for the photoresist while having no adverse effect to the patterning process. Also, at the same time, the disclosed polymer can minimize alteration or distortion of the pattern caused by diffused reflection. A method for preparing the disclosed organic anti-reflective coating polymer is also provided.

A disclosed organic anti-reflective coating composition comprising the organic anti-reflective coating polymer, a patterning method using the same and a semiconductor produced by the patterning method are all disclosed.

A disclosed organic anti-reflective coating polymer is represented by the following general formula I having a weight average molecular weight in the range of 1000 to 1,000,000.

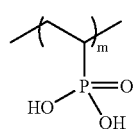

Formula I wherein m is an integer ranging from 5 to 5000.

The disclosed anti-reflective coating polymer has a lower absorbance with respect to a light source having a wavelength of 193 nm or 157 nm and can transmit most of light for forming the pattern during the exposure process for the photoresist. Further, since the disclosed polymer is a water-soluble material to be easily dissolved in a developing solution and has no significant effect on the patterning process. It is therefore preferably useable as an anti-reflective coating material to be introduced on top portion of the photoresist. Also, because the disclosed polymer contains phosphoric acid inside itself and can neutralize amines, it can minimize the effect of the post exposure delay and, simultaneously, have an optimum refractive index to help the diffused reflection from the bottom film layer to be minimized. As a result, the disclosed anti-reflective polymer coating material can be employed with conventional anti-reflective coatings and can significantly reduce distortion of the pattern generated by the diffused reflection.

As described above, the disclosed organic anti-reflective coating polymer has a weight average molecular weight ranging from about 1,000 to about 1,000,000, preferably from about 2,000 to about 10,000. Such a range of molecular weight is defined in consideration of physical properties such as solubility of the anti-reflective coating in water or other developing solutions and/or absorbance thereof. If such molecular weight is excessively high, the solubility of the polymer may decrease, thereby possibly causing difficulty in producing the anti-reflective coating composition and the coating itself or in dissolving the polymer in the developing solution resulting in problems with respect to the patterning process and further processes. When the molecular weight is too low, the anti-reflective coating may not be sufficiently formed.

A poly (vinylphosphonic acid) polymer having a structure represented by formula I is prepared by dissolving a vinylphosphonic acid having a structure represented by formula II in an organic solvent, adding a polymerization initiator to the dissolved material, then, conducting free-radical polymerization under vacuum conditions, at a temperature ranging from about 60 to about 70° C. for a time period ranging from about 2 to about 6 hours. The disclosed coating polymer can be prepared by carrying out the free-radical polymerization of existing and well-known monomers.

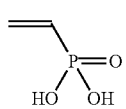

Formula II

In the disclosed method for producing the above polymer, as the molecular weight of the produced polymer is dependent on the amount of the organic solvent and reaction time, the above polymer with a molecular weight suitable for use as an anti-reflective coating polymer can be produced by continuously conducting the reaction for a time period ranging from about 2 to about 6 hours.

The organic solvent used for polymerization includes general solvents useable in free-radical polymerization. Particularly, such solvent preferably includes, but not be limited to, at least one selected from a group consisting of tetrahydrofuran, cyclohexanone, dimethyl formamide, dimethyl sulfoxide, dioxane, methylethylketone, PGMEA, ethylacetate, benzene, toluene and xylene. The polymerization initiator used includes all of conventional radical initiators for the free-radical polymerization and, preferably, at least one selected from a group consisting of 2,2'-azobisisobutyronitrile (AIBN), benzoyl peroxide, acetyl peroxide, lauryl peroxide, t-butyl peracetate, t-butyl hydroperoxide and di-t-butyl peroxide.

A disclosed organic anti-reflective coating composition comprising a polymer represented by the following formula I and having an average molecular weight in the range from about 1,000 to about 1,000,000; and any one selected from a group consisting of a polymer represented by the following formula III and having an average molecular weight in the range from about 1,000 to about 1,000,000, a polymer represented by the following formula IV and having an average molecular weight in the range from about 1,000 to about 1,000,000 and a mixture thereof.

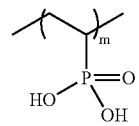

Formula I

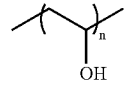

Formula III

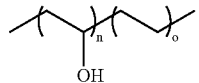

Formula IV wherein, in the above formulas, m, n and o are an integer ranging from 5 to 5000.

Briefly, the above composition comprises the polymer represented by formula I as a primary component and further includes any one selected from the polymers represented by formulas III or IV, all of which have a higher solubility with respect to water and include hydrophilic functional groups in molecules not to be miscible with the photosensitive agent, and have a less absorbance of light at 193 nm or 157 nm wavelength to allow most of the light to be transmitted at the exposure process, thereby not causing any obstacle to the patterning process or further processes. Accordingly, the disclosed anti-reflective coating composition may be preferably employed to form the anti-reflective coating on top portion of the photoresist.

In addition to the above, the polymer with the formula I can minimize the effect of the post exposure delay and the diffused reflection from the bottom portion, simultaneously, and the disclosed coating composition comprises further hydroxy groups capable of generating cross-linked bonds as well as the polymer. Also, the composition comprises the polymers represented by the formula III or IV to ensure improved formation of the anti-reflective coating. As a result, when used, the disclosed composition, comprising such constitutional components describe above, it is possible to form an anti-reflective coating on top portion of a photoresist, the anti-reflective coating capable of eliminating a problems of the diffused reflection and/or the post exposure delay without causing a trouble in the patterning process.

All of the polymers represented by formulas III of IV contained in the disclosed composition are generally known polymer materials, which are produced by any conventional methods or commercially available on the market.

In the organic anti-reflective coating composition of the present invention, amount of the polymer represented by formula I may be in the range of from about 1 to about 70% by weight with respect to total amount of the composition and, preferably, in the range of from about 1 to about 20% by weight. Likewise, the amount of polymer represented by formulas III or IV is in the range of from about 1 to about 30% by weight and, preferably, in the range of 1 to 20% by weight.

Since the coating composition is typically supplied in the form of an aqueous solution, it can be prepared by mixing each of the polymers having the amount defined above and the balance of water, dissolving the polymers in water and, then, filtering the dissolved solution through a filter having about a 0.2 μm pore size to produce the final composition as above.

Additionally, in case of introducing the anti-reflective coating on top portion of the photoresist by using the disclosed coating composition, this may cause a slight slope or loss of the top portion of a profile of pattern based on practical process condition. Optionally, this problem can be solved by adding an amine compound to the coating composition of the present invention. Such an amine compound generally includes both aliphatic alkylamines and aliphatic alkylammonium salts.

There is also provided a method for forming pattern on a semiconductor device comprising: (a) coating a photoresist film on a semiconductor substrate formed a desired bottom structure; (b) applying an organic anti-reflective coating compositing on the top portion of the photoresist film; and (c) exposing and developing the photoresist film to produce the desired photoresist pattern.

According to the above patterning process, it is possible to prevent and/or substantially eliminate contamination of the photoresist caused by the post exposure delay status and distortion of the pattern generated by the diffused reflection by forming the anti-reflective coating with the disclosed organic anti-reflective coating composition after coating the photoresist. Such anti-reflective coating has a higher solubility in the developing solution and no effect on the patterning process.

With respect to the disclosed patterning process, the process may further include an additional baking process before or after the exposure process, which is preferably conducted at a temperature ranging from about 70 to about 200° C.

Although the disclosed anti-reflective coating composition and patterning process are mostly adapted to ultrafine pattern formation processes using ArF light source with 193 nm or VUV light source with 157 nm, they can be also applied to other ultrafine pattern formation processes using KrF(248 nm), EUV(13 nm), E-beam, X-ray or ionic beam. The exposure process using such light sources is preferably performed with specified exposing energy in the range of from about 0.1 to about 50 mJ/cm$^2$.

In the disclosed patterning process, the development process can be carried out by employing an alkali developing solution. As such an alkali developing solution, preferably comprises from about 0.01 to about 5% by weight tetramethyl ammonium hydroxide (abbreviated to TMAH) in water.

There is also provided a semiconductor device produced by the patterning process described above.

BRIEF DESCRIPTION OF THE DRAWINGS

Other aspects of the disclosed polymers, compositions and methods will become apparent from the following description of examples with reference to the accompanying drawings wherein.

DESCRIPTION OF THE PRESENTLY PREFERRED EMBODIMENTS

Figure 1:
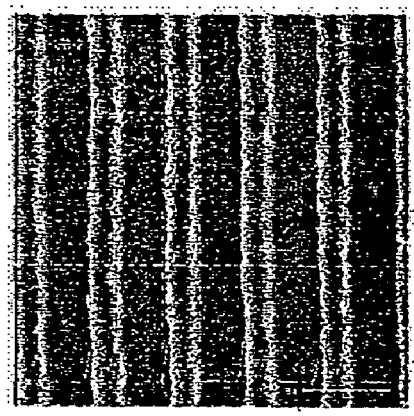
FIG. 1 is a scanning electron microscopic (SEM) photograph illustrating a pattern formed by introducing the anti-reflective coating composition prepared in Example 2 on a top portion of a photoresist.

The following examples, are merely illustrative and are not intended to limit the scope of this disclosure.

EXAMPLE 1

Preparation of an Organic Anti-Reflective Coating Polymer:

10 g of vinylphosphonic acid and 0.1 g of AIBN were dissolved in 30 ml of tetrahydrofuran. The dissolved mixture was reacted at 65 to 70° C. for 3 hours. After completing the reaction, the obtained compound was deposited in acetone then the precipitate was filtered and dried to produce the organic anti-reflective coating polymer represented by formula I in amount of 8.9 g (89%). Observation of the resulting polymer revealed that it has a weight average molecular weight of 4,530 and Pd=1.37.

EXAMPLE 2

Preparation of Organic Anti-reflective Coating Composition:

3 g of the polymer prepared from Example 1 and 7 g of polyvinylalcohol polymer having a weight average molecular weight of 2,000 and represented by formula III were dissolved in 500 ml of deionized water. The dissolved mixture passed through a filter having 0.2 μm pore size to produce the desired organic anti-reflective coating composition.

EXAMPLE 3

Preparation of Organic Anti-reflective Coating Composition:

3 g of the polymer prepared from Example 1 and 7 g of poly (vinylalcohol-ethylene) copolymer having a molecular weight ranging from 8,500 to 14,600 and represented by formula IV were dissolved in 500 ml of deionized water. The dissolved mixture passed through a filter having 0.2 μm pore size to produce the desired organic anti-reflective coating composition.

EXAMPLE 4

Preparation of Organic Anti-reflective Coating Composition:

3 g of the polymer prepared from Example 1, 3 g of poly (vinylalcohol-ethylene) copolymer having a molecular weight ranging from 8,500 to 14,600 and represented by formula IV and 5 g of polyvinylalcohol having a molecular weight of 2,000 and represented by formula III were dissolved in 500 ml of deionized water. The dissolved mixture passed through a filter having 0.2 μm pore size to produce the desired organic anti-reflective coating composition.

EXAMPLE 5

Formation of the Photoresist Pattern:

On a silicone wafer previously treated with hexamethyl disilazane (HMDS), formed was a film to be etched. To top portion of the film, AX1120P (manufactured by Clariant Co.) as one of methacrylate type photosensitive agent was spin-coated to prepare a photoresist thin film having a thickness of 2,000 Å, then, a soft baking process was conducted for the obtained photoresist thin film in an oven at 130° C. for 90 seconds. Thereafter, by spin-coating the organic anti-reflective coating composition prepared in Example 2 at 3,000 rpm, the anti-reflective coating, that is, the top ARC having a thickness of 200 Å was coated on the top portion of the photoresist. After conducting the soft-baking process, an exposure process was carried out by an exposure apparatus having 0.63NA ArF laser and following a post-baking process in the oven at 130° C. for 90 seconds. After completion of the baking process, the baked product was immersed in an aqueous solution of 2.38% by weight of tetramethylammonium hydroxide for 30 seconds to be developed. The developed material was washed by a spray of deionized water then following a drying step to obtain an ultra-fine photoresist pattern with 90 nm L/S.

The photoresist pattern formed by the above method was illustrated in FIG. 1.

EXAMPLE 6

Formation of Photoresist Pattern:

The ultra-fine photoresist pattern with 90 nm L/S was obtained in the same manner as in Example 5, except that the composition from the Example 3 was used instead of the composition obtained in Example 2.

Figure 2:
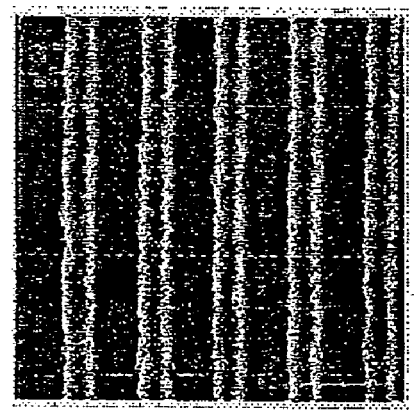
FIG. 2 is an electron microscopic photograph illustrating a pattern formed by introducing the anti-reflective coating composition prepared in Example 3 on a top portion of the photoresist.

The photoresist pattern formed by the above method was illustrated in FIG. 2.

EXAMPLE 7

Formation of Photoresist Pattern:

The ultra-fine photoresist pattern with 90 nm L/S was obtained in the same manner as in Example 5, except that the composition from the Example 4 was used instead of the composition obtained in Example 2.

Figure 3:
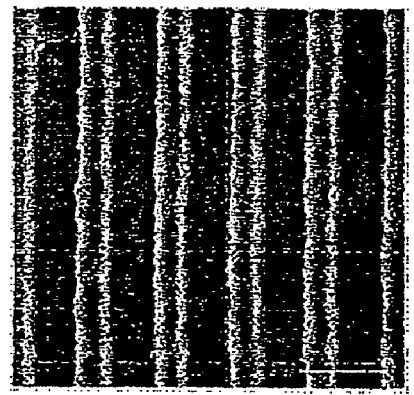
FIG. 3 is an electron microscopic photograph illustrating a pattern formed by introducing the anti-reflective coating composition prepared in Example 4 on a top portion of the photoresist.

The photoresist pattern formed by the above method was illustrated in FIG. 3.

COMPARATIVE EXAMPLE 1

Figure 4:
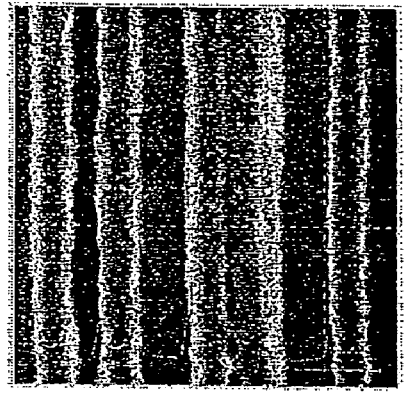
FIG. 4 is an electron microscopic photograph illustrating a conventional photoresist pattern as described in Comparative Example 1 without introduction of the disclosed anti-reflective composition.

Formation of Photoresist Pattern According to the Prior Art:

The ultra-fine photoresist pattern with 90 nm L/S was obtained in the same manner as in Example 5 without employing the disclosed composition. The photoresist pattern formed by the above method was illustrated in FIG. 4. As shown in FIG. 4, distortion of pattern caused by the diffused reflection was observed under a condition of 5 ppb amine density when the ultra-fine pattern was formed without using the anti-reflective coating composition of the present invention.

EXAMPLE 8

Figure 5:
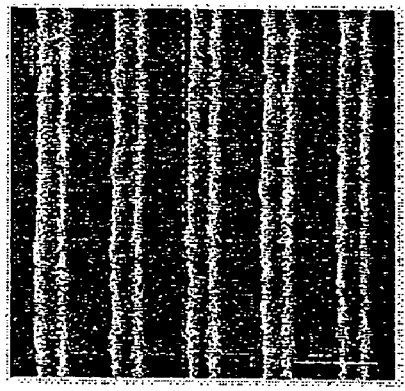
FIG. 5 is an electron microscopic photograph illustrating a photoresist pattern formed by introducing the anti-reflective composition prepared in Example 3 on a top portion of the photoresist 5 minutes after exposure.
Figure 6:
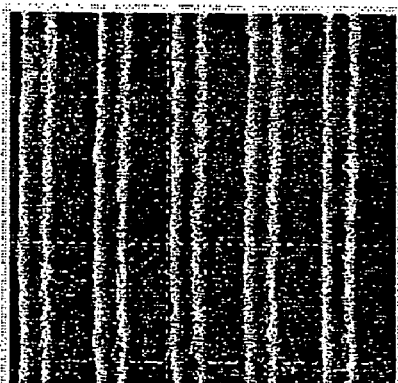
FIG. 6 is an electron microscopic photograph illustrating a photoresist pattern formed by introducing the anti-reflective composition prepared in Example 3 on a top portion of the photoresist 30 minutes after exposure.

Evaluation of the Effect by the Post Exposure Delay:

With respect to the photoresist pattern formed by a process described in Example 6, by observing variation in shape of the pattern depending on time passed, the effect of the post exposure delay was determined. The resultant pattern of 5 minutes after the exposure was illustrated in FIG. 5 while the pattern of 30 minutes after the exposure being shown in FIG. 6.

In addition to the above, Critical Dimensions (CDs) of such patterns were listed in the following Table 1.

TABLE 1

| Extended time | Immediately after exposure (FIG. 2) | 5 minutes after exposure (FIG. 5) | 30 minutes after exposure (FIG. 6) |
|---|---|---|---|
| CD | 89 nm | 87 nm | 90 nm |

As illustrated in the above Table 1 and accompanying Figures, it can be seen that the effect of the post exposure delay can be minimized even if the post exposure delay was generated when the ultra-fine pattern was formed by using the disclosed organic anti-reflective coating composition, since the shape of the pattern was retained without alteration and/or distortion thereof.

As above mentioned, it is possible to minimize the effect of the post exposure delay and distortion phenomenon of the pattern caused by the diffused reflection while not causing an obstacle to the patterning process or further processes by introducing the organic anti-reflective coating on top portion of the photoresist.

Especially, diffused reflection is minimized as is damage of the patterns by applying the disclosed anti-reflective coating in addition to conventional anti-reflective coating introduced to the bottom portion of the photoresist to result in much less damage in the pattern, whereby the disclosed anti-reflective coating can significantly contribute to the stability of photolithography process at less than 90 nm.

It will be obvious that the disclosed polymers, compositions and methods may be varied in many ways. Such variations are not to be regarded as a departure from the spirit and scope of this disclosure, and all such modifications as would be obvious to one skilled in the art are intended to be included within the scope of the following claims.

What is claimed is:

1. A method for forming a pattern on a semiconductor device comprising:
    coating a photoresist film on a semiconductor substrate;

applying an organic anti-reflective coating composition on a top portion of the photoresist film, the organic anti-reflective coating comprising
a polymer represented by the following formula I

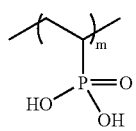

Formula I wherein m is an integer ranging from 5 to 5000; and
exposing and developing the photoresist film to produce a photoresist pattern.

2. The method according to claim 1, wherein the polymer has a molecular weight ranging from about 2,000 to about 10,000.

3. A method for preparing the organic anti-reflective coating used in the pattern forming method of claim 1 comprising:
dissolving vinylphosphonic acid having a structure represented by the following formula II in organic solvent;
adding a polymerization initiator to the dissolved solution; and
conducting free-radical polymerization under vacuum condition, at a temperature ranging from about 60 to about 70° C. for a time period ranging from about two hours to about six hours to produce the organic anti-reflective coating polymer of Formula 1 of claim 1:

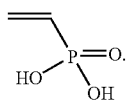

Formula II

4. The method according to claim 3, wherein the organic solvent comprises at least one material selected from the group consisting of tetrahydrofuran, cyclohexanone, dimethyl formamide, dimethyl sulfoxide, dioxane, methylethylketone, PGMEA, ethylacetate, benzene, toluene, xylene, and mixtures thereof.

5. The method according to claim 3, wherein the polymerization initiator comprises a material selected from the group consisting of 2,2'-azobis isobutyronitrile (AIBN), benzoyl peroxide, acetyl peroxide, lauryl peroxide, t-butyl peracetate, t-butyl hydroperoxide, di-t-butyl peroxide, and mixtures thereof.

6. The method according to claim 4, wherein the polymerization initiator comprises a material selected from the group consisting of 2,2'-azobis isobutyronitrile (AIBN), benzoyl peroxide, acetyl peroxide, lauryl peroxide, t-butyl peracetate, t-butyl hydroperoxide, di-t-butyl peroxide, and mixtures thereof.

7. A method for forming a pattern on a semiconductor device comprising the steps of:
coating a photoresist film on a semiconductor substrate;
applying an organic anti-reflective coating composition on a top portion of the photoresist film; and
exposing and developing the photoresist film to produce a photoresist pattern,
said coating composition comprising:
a polymer represented by the following formula I; and
at least one polymer selected from a the group consisting of formula III, formula IV and mixtures thereof:

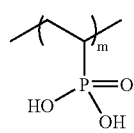

Formula I

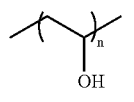

Formula III

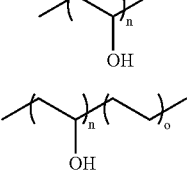

Formula IV wherein, in above formulas, m, n and o are integers ranging from 5 to 5000.

8. The method according to claim 7, further comprising a baking process before or after the exposing step.

9. The method according to claim 8, comprising carrying out the developing step using an aqueous solution of about 0.01 wt % to about 5 wt % tetramethylanimonium hydroxide (TMAH) as a developing solution.

10. The method according to claim 7, comprising carrying out the developing step using an aqueous solution of about 0.01 wt % to about 5 wt % tetramethylammonium hydroxide (TMAH) as a developing solution.

* * * * *